United States Patent
Sauter et al.

(10) Patent No.: US 11,282,806 B2
(45) Date of Patent: Mar. 22, 2022

(54) PARTITIONED SUBSTRATES WITH INTERCONNECT BRIDGE

(71) Applicant: MARVELL ASIA PTE, LTD., Singapore (SG)

(72) Inventors: Wolfgang Sauter, Burke, VT (US); Mark W. Kuemerle, Essex Junction, VT (US); Eric W. Tremble, Jericho, VT (US)

(73) Assignee: Marvell Asia Pte, Ltd., Singapore (SG)

( * ) Notice: Subject to any disclaimer, the term of this patent is extended or adjusted under 35 U.S.C. 154(b) by 4 days.

(21) Appl. No.: 16/599,738

(22) Filed: Oct. 11, 2019

(65) Prior Publication Data

US 2021/0111141 A1 Apr. 15, 2021

(51) Int. Cl.
*H01L 23/48* (2006.01)
*H01L 23/00* (2006.01)
*H01L 25/065* (2006.01)
*H01L 23/31* (2006.01)

(52) U.S. Cl.
CPC .......... *H01L 24/29* (2013.01); *H01L 23/3142* (2013.01); *H01L 24/13* (2013.01); *H01L 25/0655* (2013.01)

(58) Field of Classification Search
CPC ............. H01L 24/29; H01L 1323/3142; H01L 25/0655; H01L 24/13; H01L 2924/15788; H01L 2924/16175; H01L 2924/16588; H01L 2924/16788; H01L 2924/17788; H01L 23/55–5389; H01L 21/76898; H01L 23/373–3738; H01L 29/7842–7849; H01L 2924/351–35121; H01L 23/3675; H01L 23/49816; H01L 23/42; H01L 23/5385; H01L 2225/06572; H01L 23/053; H01L 23/16; H01L 23/562; H01L 25/50; H01L 2924/15192; H01L 2924/15311; H01L 2924/16251; H01L 23/5386; H01L 23/5383; H01L 23/5381; H01L 23/04
USPC ........................................................ 257/782
See application file for complete search history.

(56) References Cited

U.S. PATENT DOCUMENTS

| | | | |
|---|---|---|---|
| 7,989,929 B2 | 8/2011 | Fjelstad et al. | |
| 2009/0108416 A1* | 4/2009 | Fjelstad | H05K 1/147 257/664 |
| 2013/0168854 A1* | 7/2013 | Karikalan | H01L 24/73 257/738 |
| 2013/0200511 A1* | 8/2013 | Banijamali | H01L 25/0652 257/737 |
| 2017/0092619 A1* | 3/2017 | Refai-Ahmed | H01L 21/4882 |
| 2018/0182707 A1 | 6/2018 | Elsherbini et al. | |
| 2019/0051587 A1 | 2/2019 | Azeroual et al. | |

(Continued)

OTHER PUBLICATIONS

U.S. Appl. No. 15/988,638 titled "Fan-Out Connections of Processors on a Panel Assembly Background", filed May 24, 2018, 20 pages.

*Primary Examiner* — Cuong B Nguyen

(57) ABSTRACT

The present disclosure relates to semiconductor structures and, more particularly, to partitioned substrates with interconnect bridge structures and methods of manufacture. The structure includes: a plurality of substrates; at least one chip bonded and electrically connected to each of the plurality of substrates; and an interconnect bridge that physically connects the plurality of substrates and electrically connects each of the plurality of chips bonded to each of the plurality of substrates.

22 Claims, 6 Drawing Sheets

(56) References Cited

U.S. PATENT DOCUMENTS

| | | | |
|---|---|---|---|
| 2019/0295952 A1* | 9/2019 | Sikka | H01L 23/5385 |
| 2020/0066641 A1* | 2/2020 | Aygun | H01L 25/0655 |
| 2020/0243448 A1* | 7/2020 | Qian | H01L 24/24 |
| 2020/0364600 A1* | 11/2020 | Elsherbini | H01L 21/486 |
| 2021/0005546 A1* | 1/2021 | Pang | H01L 23/5386 |

* cited by examiner

PARTITIONED SUBSTRATES WITH INTERCONNECT BRIDGE

FIELD OF THE INVENTION

The present disclosure relates to semiconductor structures and, more particularly, to partitioned substrates with interconnect bridge structures and methods of manufacture.

BACKGROUND

Package sizes used in wired network switching applications are continually growing. For example, next generation wired networking switch applications require large packages to escape the increasing number of Serializer/Deserializer (SerDes) lanes at higher speed. For example, each SerDes lane requires four (4) signals ball grid arrays (BGAs) plus a larger number of isolation BGAs. Also, increasing speed of SerDes signals increases the number of required isolation BGAs. This leads to the need for larger substrates.

Substrate size growth for high signal count applications leads to exponential cost increases for products. For example, a SerDes speed of 30 Gbps requires 12 total BGA/lanes; whereas 60 Gbps requires 13.5 total BGA/lanes and 116 Gbps requires 15 total BGA/lanes. To accommodate the increased number of BGAs/lanes, a larger substrate is required; however, substrate size is a main driver of increased cost. That is, substrate size growth for high signal count applications leads to exponential cost increases for the product. In fact, recent data has shown that there is a significant increase in substrate cost above 75 mm substrate size.

SUMMARY

In an aspect of the disclosure, a structure comprises: a plurality of substrates; at least one chip bonded and electrically connected to each of the plurality of substrates; and an interconnect bridge that physically connects the plurality of substrates and electrically connects each of the plurality of chips bonded to each of the plurality of substrates.

In an aspect of the disclosure, a structure comprises: a plurality of substrates with wiring layers; a chip electrically connected to each of the plurality of substrates through the wiring layers; an interconnect bridge electrically connecting the plurality of chips to each other and physically and electrically connecting the plurality of substrates to one another; and a lid covering the chip on each of the plurality of substrates.

In an aspect of the disclosure, a structure comprising: a system card; a plurality of substrates with wiring layers, the plurality of substrates being attached to the system card; a chip electrically connected to each of the plurality of substrates through at least one of the wiring layers; an interconnect bridge electrically connecting the chip of each of the plurality of substrates to each other and physically connecting the plurality of substrates to one another from either an underside or a top side; a thermal interface material covering the interconnect bridge and the chip of each of the plurality of substrates; and a lid adhered to selected ones of the plurality of substrates and covering the chip of the plurality of substrates and the thermal interface material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to partitioned substrates with interconnect bridge structures and methods of manufacture. More specifically, the present disclosure provides smaller partitioned substrates with a high density interconnect bridge physically connecting the partitioned substrates. Advantageously, the smaller partitioned substrates provide a significant cost reduction, which could reach approximately 50% for next generation networking products.

In embodiments, the high density interconnect bridge electrically connects adjacent integrated chips mounted on a package substrate. The interconnect bridge comprises a rigid substrate with wiring for electrically interconnecting the adjacent integrated chips and physically connecting the partitioned substrates to one another. The interconnect bridge enables, for example, the package substrate to be at or below 75 mm size in various configurations. In more specific embodiments, the partitioned substrates can be about 60 mm substrates while still enabling high density interconnects between chips and maintaining the ability for a thermal solution (e.g., lid/stiffener).

By way of example, two 60 mm substrates can be connected together with a high single density interconnect bridge. The two 60 mm substrates can accommodate approximately the same amount of ball grid arrays (BGA) as a single 85 mm substrate (e.g., approximately 7000 BGA) but at a significantly reduced cost. The two 60 mm substrates can also accommodate two or more chips similar to a single larger sized substrate.

The partitioned substrates with interconnect bridge structures of the present disclosure can be manufactured in a number of ways using a number of different tools. In general, though, the methodologies and tools are used to form structures with dimensions in the micrometer and nanometer scale. The methodologies, i.e., technologies, employed to manufacture the partitioned substrates with interconnect bridge structures of the present disclosure have been adopted from integrated circuit (IC) technology. In particular, the fabrication of the partitioned substrates with interconnect bridge structures uses three basic building blocks: (i) deposition of thin films of material on a substrate, (ii) applying a patterned mask on top of the films by photolithographic imaging, and (iii) etching the films selectively to the mask.

Figure 1A:
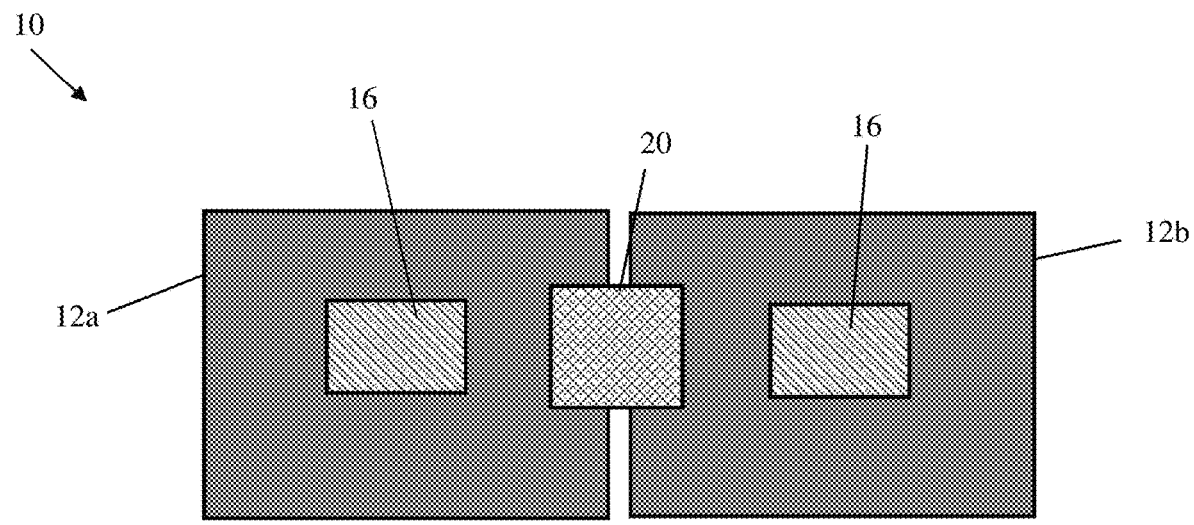
FIG. 1A shows a top view of partitioned substrates and an interconnect bridge assembly in accordance with aspects of the present disclosure.
Figure 1B:
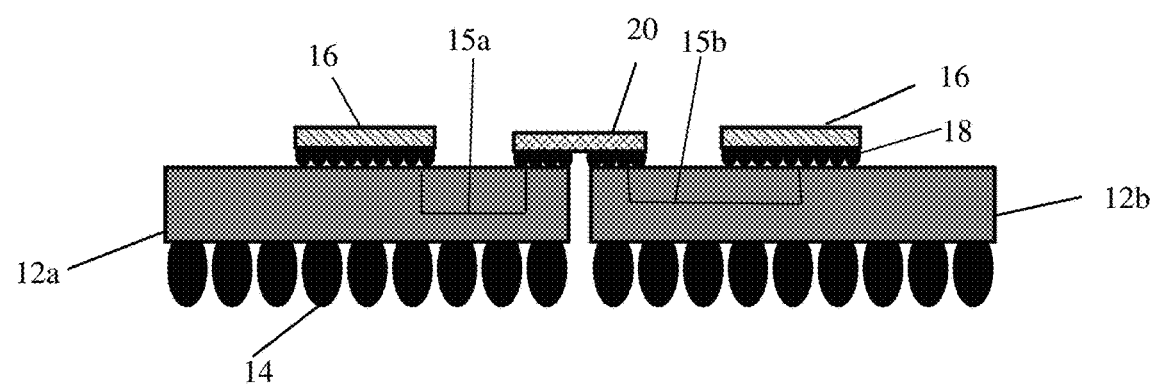
FIG. 1B shows a cross-sectional view of the partitioned substrates and interconnect bridge assembly of FIG. 1A in accordance with aspects of the present disclosure.

FIG. 1A shows a top view of partitioned substrates and an interconnect bridge assembly in accordance with aspects of the present disclosure; whereas, FIG. 1B shows a cross-sectional view of the partitioned substrates and interconnect bridge assembly of FIG. 1A. More specifically, the package assembly 10 shown in FIGS. 1A and 1B includes a plurality of substrates 12a, 12b. In embodiments, the substrates 12a, 12b can be any known type of substrates which are used to mount integrated chips 16 thereon. For example, the substrates 12a, 12b can include a core with wiring layers 15 formed over and under the core. In embodiments, the substrates 12a, 12b (e.g., partitioned substrates) are preferably less than 75 mm and more preferably not larger than 60 mm in size.

The substrates 12a, 12b include ball grid arrays (BGAs) 14 and wiring layers 15. As one of skill in the art will recognize, the BGAs 14 are a type of surface-mount packaging (a chip carrier) such that no further explanation is required herein. The wiring layers 15 are used for wiring (e.g., connecting) the substrates 12a, 12b to the chips 16 and the chips 16 of different substrates 12a, 12b to one another via an interconnect bridge 20. The chips 16 are mounted to the substrates 12a, 12b by any conventional mounting connections 18, e.g., solder bumps or controlled collapse chip connection (C4).

Figure 6:
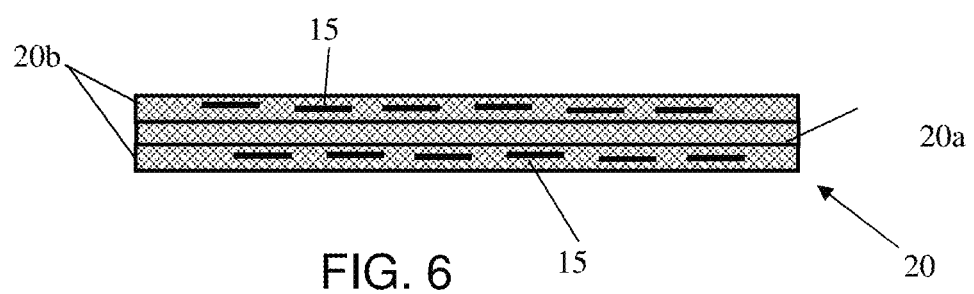
FIG. 6 shows a cross-sectional view of the interconnect bridge assembly in accordance with aspects of the present disclosure.

As further shown in FIGS. 1A and 1B, the interconnect bridge 20 connects two substrates 12a, 12b together from a top surface. In embodiments, the interconnect bridge 20 can be composed of the same materials or different materials (as shown in FIG. 6) as the substrates 12a, 12b. The interconnect bridge 20 can be a high density interconnect bridge connecting together the partitioned substrates 12a, 12b and, importantly allowing electrical communication between the different chips 16 on the different substrates 12a, 12b via the wiring 15. Accordingly, by using the interconnect bridge 20, it is now possible to reduce the size of the substrates 12a, 12b thereby maintaining the cost savings of the smaller substrates 12a, 12b, while also providing the functionality of different chips 16. Also, the assembly 10 maintains the signal integrity, particularly in view of a configuration where the wiring 15 does not go through the core of the substrates 12a, 12b. Moreover, the interconnect bridge 20 enables easy assembly at the board level, while also lowering stress due to a lower distance to neutral point (DNP).

Figure 2A:
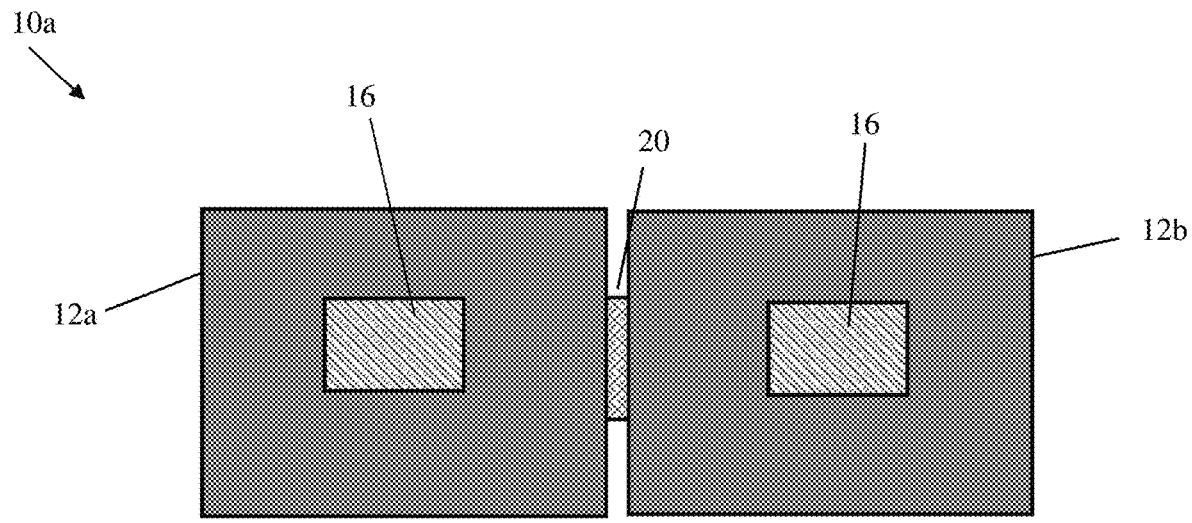
FIG. 2A shows a top view of partitioned substrates and an interconnect bridge assembly in accordance with additional aspects of the present disclosure.
Figure 2B:
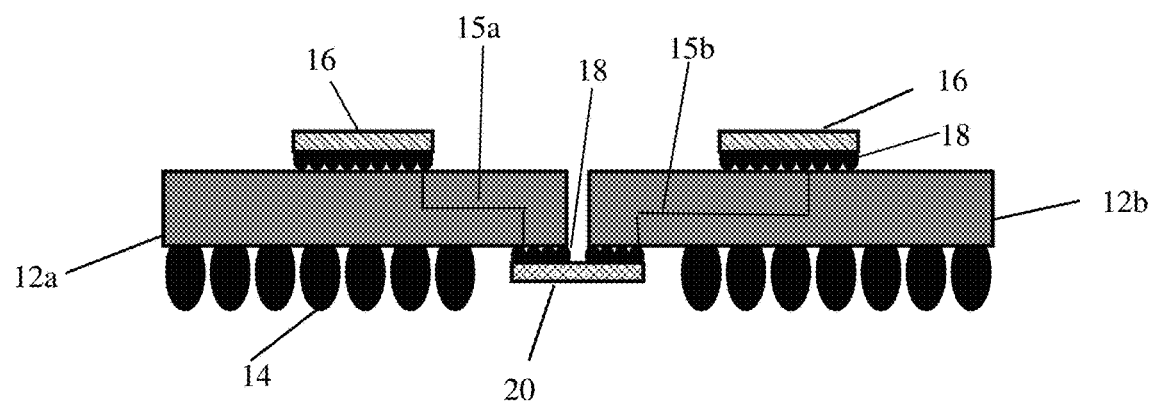
FIG. 2B shows a cross-sectional view of the partitioned substrates and interconnect bridge assembly of FIG. 2A in accordance with aspects of the present disclosure.

FIG. 2A shows a top view of the partitioned substrates and an interconnect bridge assembly in accordance with additional aspects of the present disclosure; whereas FIG. 2B shows a cross-sectional view of the partitioned substrates and interconnect bridge assembly of FIG. 2A. In FIGS. 2A and 2B, the interconnect bridge 20 connects the substrates 12a, 12b together from an underside of the assembly 10b (substrates 12a, 12b), e.g., same surface as the BGAs 14. In this configuration, additional space is now available on the top side of the substrates 12a, 12b. The remaining features are similar to the assembly 10 shown in FIGS. 1A and 1B.

Figure 3:
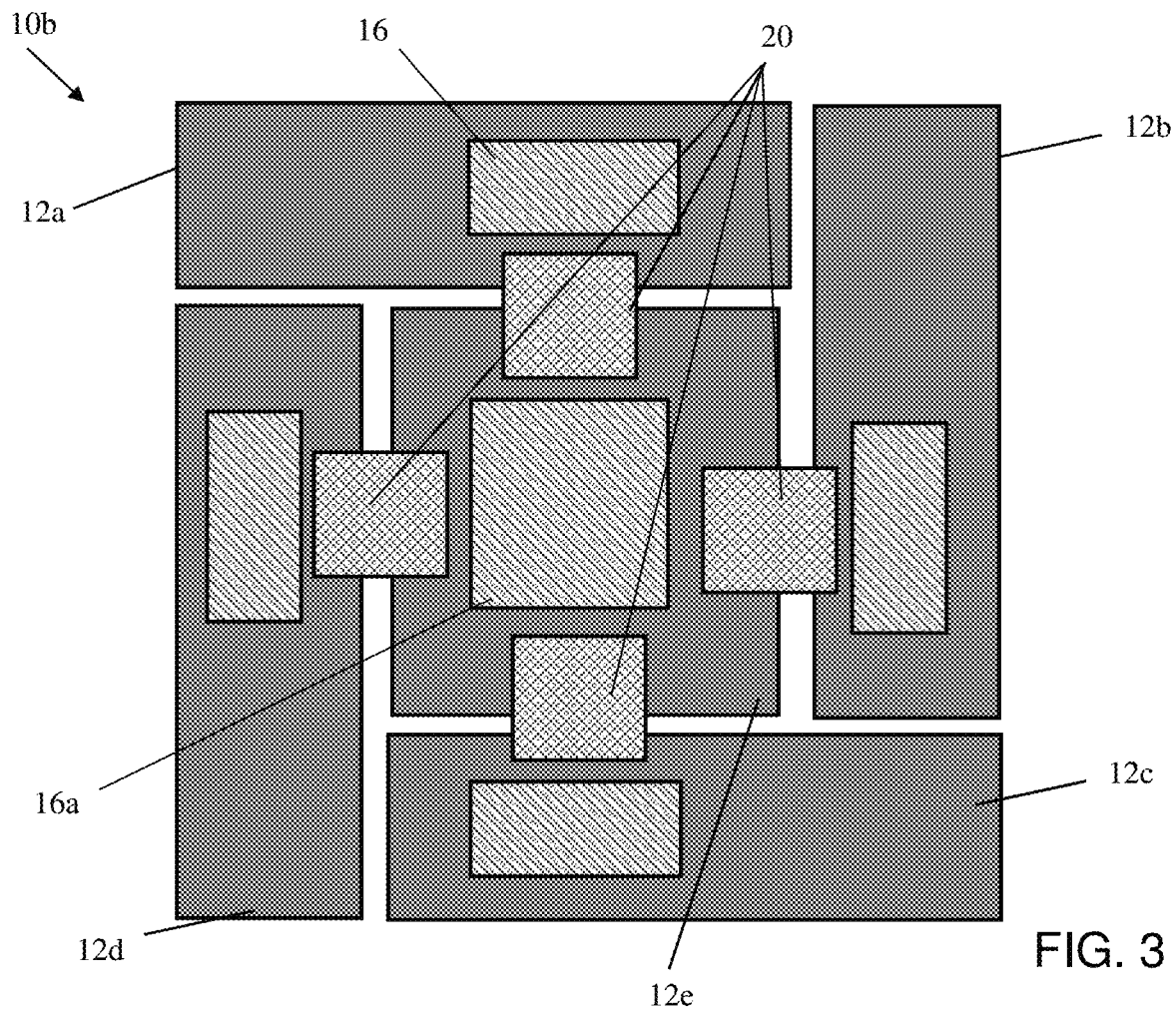
FIG. 3 shows a top view of additional partitioned substrates and interconnect bridge assemblies in accordance with aspects of the present disclosure.

FIG. 3 shows a top view of the partitioned substrates and interconnect bridge assemblies in accordance with aspects of the present disclosure. More specifically, the assembly 10b shown in FIG. 3 includes a plurality of substrates 12a, 12b, 12c, 12c, 12d, 12e with respective chips 16, 16a mounted thereon. In embodiments, the chip 16a can be larger than the remaining chips 16; although other configurations are also contemplated herein. In this configuration, the substrates 12a, 12b, 12c, 12c, 12d, 12e are connected together by a plurality of respective interconnect bridges 20. As noted with respect to FIGS. 1A-2B, the interconnect bridges 20 are high density interconnect bridges allowing communication between the different chips 16, 16a on the different substrates 12a, 12b, 12c, 12c, 12d, 12e via wiring embedded with the substrates 12a, 12b, 12c, 12c, 12d, 12e.

It should be recognized that the assembly 10b shown in FIG. 3 is merely an illustrative example and that other configurations are contemplated herein. By way of illustrative non-limiting example, it is possible to make a 105 mm (or other size) package size with a combination of different substrates connected together by respective interconnect bridges 20. Also, the interconnect bridges 20 can be on the top side, underside or a combination thereof. Accordingly, by implementing the use of smaller substrates with the interconnect bridge 20, the assembly is scalable depending on the desired architecture.

Figure 4:
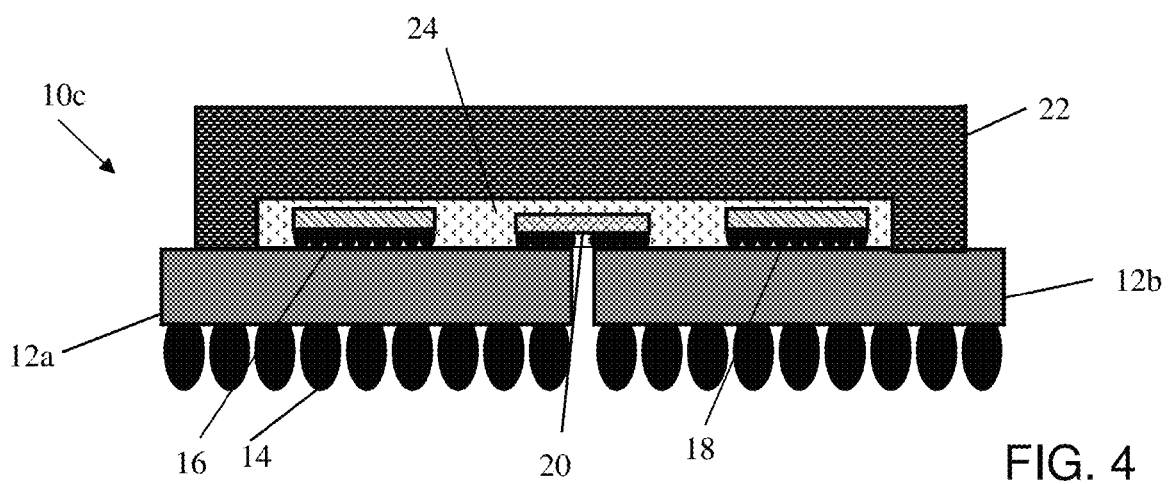
FIG. 4 shows the partitioned substrates and interconnect bridge assembly with a lid in accordance with aspects of the present disclosure.

FIG. 4 shows the partitioned substrates and interconnect bridge assembly with a lid 22 in accordance with aspects of the present disclosure. In this assembly 10c, the lid 22 is placed over the chips 16 and interconnect bridge 20. In embodiments, the lid 22 can provide further rigidity to the packaged assembly 10c. The lid 22 can be bonded to the substrates 12a, 12b with a sealing adhesive. A thermal interface material (TIM) 24 can be provided within the enclosure of the lid 22 (e.g., on an underside of the lid 22). For example, a TIM 24 can be placed over the substrates 12a, 12b, chips 16 and interconnect bridge 20. The TIM 24 can be applied by any conventional dispenser (e.g., needle dispenser) to a top side of the chips 16 and interconnect bridge 20 opposite the connections 18. In embodiments, an underfill material may be applied to the connections 18, the chips 16, the interconnect bridge 20 and the substrates 12a, 12b to at least reduce stress to the package. The lid 22 is thereafter placed on the substrates 12a, 12b, typically making contact with the seal adhesive and the chips 16 by way of the TIM 24.

Figure 5A:
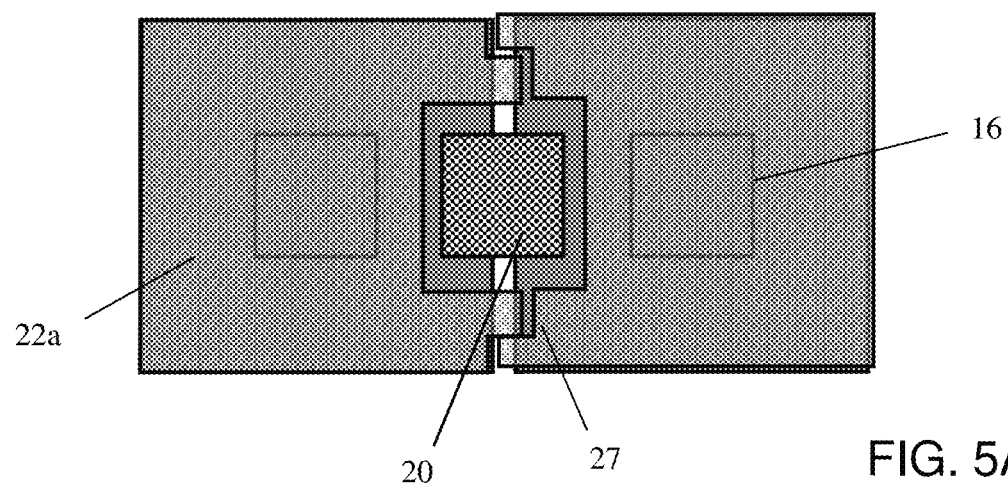
FIGS. 5A and 5B show the partitioned substrates and interconnect bridge assembly with a lid having an opening in accordance with aspects of the present disclosure.
Figure 5B:
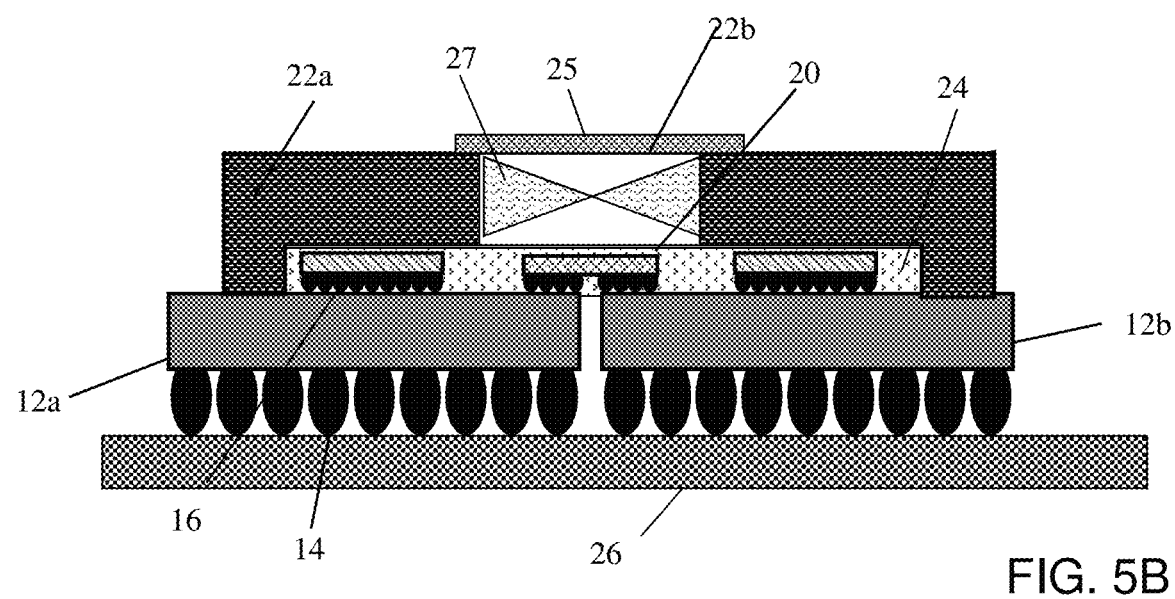

FIGS. 5A and 5B show the partitioned substrates and interconnect bridge assembly with a lid in accordance with additional aspects of the present disclosure. FIG. 5A is a top view of the lid assembly and FIG. 5B is a cross-sectional view of the lid assembly of FIG. 5A. In this assembly 10c, the lid 22a is a hinged or locking lid with an opening 22b for placement of the interconnect bridge 20 onto the substrates 12a, 12b. In embodiments, the lid 22a can be placed over and bonded to the substrates 12a, 12b with a sealing adhesive, prior to the placement of the interconnect bridge 20. In embodiments, the two sides of the lid can be locked together by a mechanical fit, spring or other locking mechanism as shown representatively at reference numeral 27. After placement of the interconnect bridge 20, TIM 24 can be provided within the enclosure of the lid 22a (via the opening 22b) using any conventional dispenser (e.g., needle dispenser). In embodiments, the opening 22b can optionally be sealed with a cap 25, for example. The cap 25 can be sealed to the upper side of the lid 22a with an adhesive. It should be understood by those of skill in the art that the lids shown in FIGS. 4 and 5 can also be used when the interconnect bridge 20 is mounted on an underside of the substrates 12a, 12b.

FIG. 6 shows a cross-sectional view of the interconnect bridge 20. In embodiments, the interconnect bridge 20 will have a total height that is smaller than the height of the BGAs as shown in FIGS. 1A-2A (when mounted from the underside) and/or a total height that is smaller than the height of the chips 16 as shown in FIGS. 1A-2A (when mounted from the topside). In embodiments, the interconnect bridge 20 is coreless.

The interconnect bridge 20 includes a dielectric layer 20a and wiring layers 20b on opposing sides of the dielectric layer 20a. In embodiments, the dielectric layer 20a and/or a combination of the dielectric layer 20a and wiring layers 20b will be a rigid substrate for electrically interconnecting the adjacent chips 16 via the substrates 12a, 12b. In further embodiments, the wiring layers 20b can be 10 to 20 layers and, more preferably, 5 to 10 layers on each side of the dielectric layer 20a. The wiring layer 20b is a dielectric material with wires 15 embedded therein. The wiring layers 15 allow communication between the interconnect bridge 20, substrates 12a, 12b, etc., and the respective chips 16, via the connections 18. In embodiments, each layer 20a, 20b of the interconnect bridge 20 can be approximately 10 microns to about 30 microns; although other dimensions are contemplated herein.

Figure 7A:
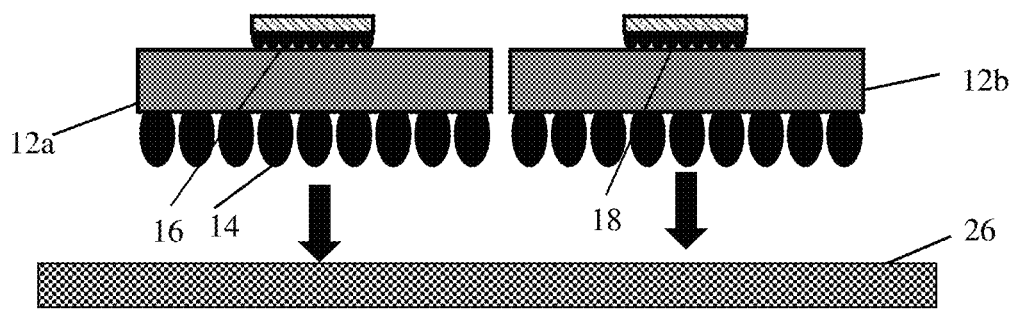
FIGS. 7A-7D show an assembly process for the partitioned substrates, interconnect bridge assembly and lid in accordance with aspects of the present disclosure.
Figure 7B:
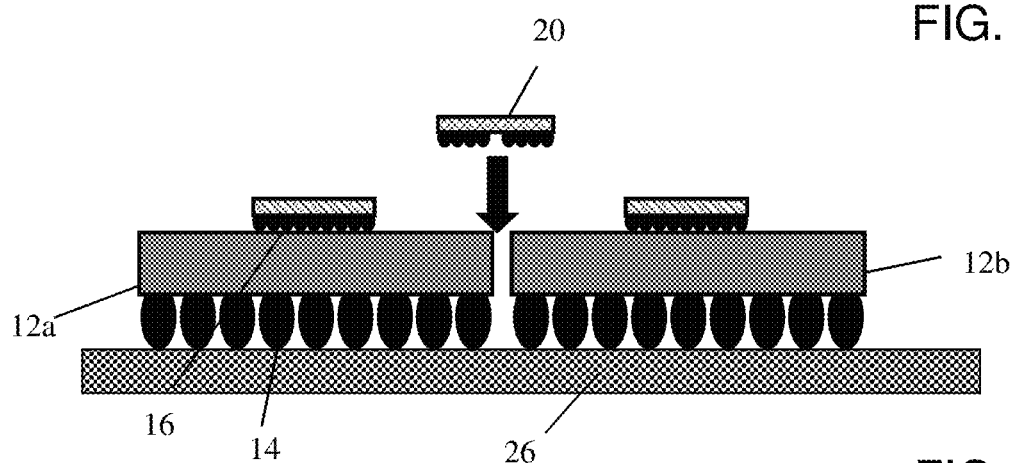
Figure 7C:
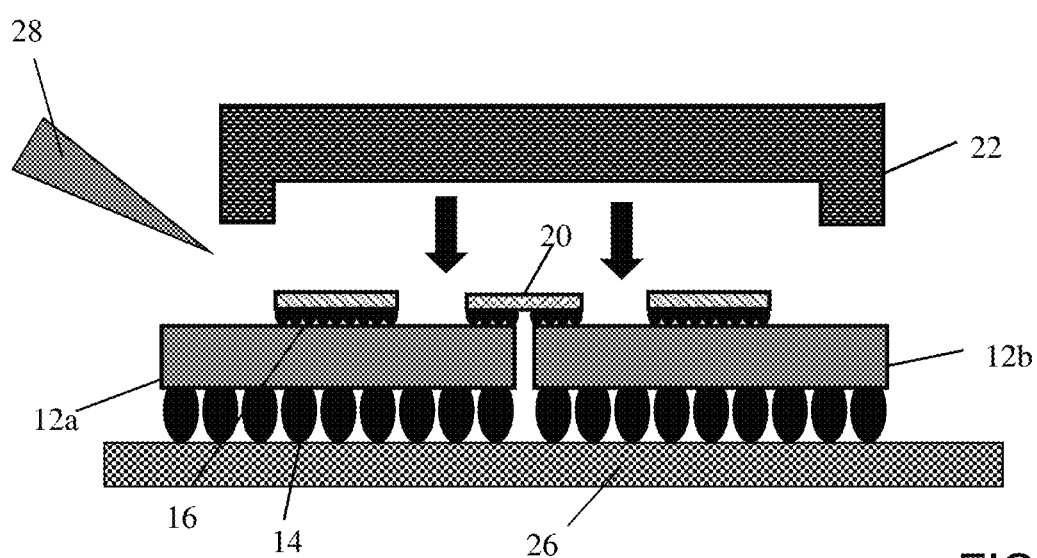
Figure 7D:
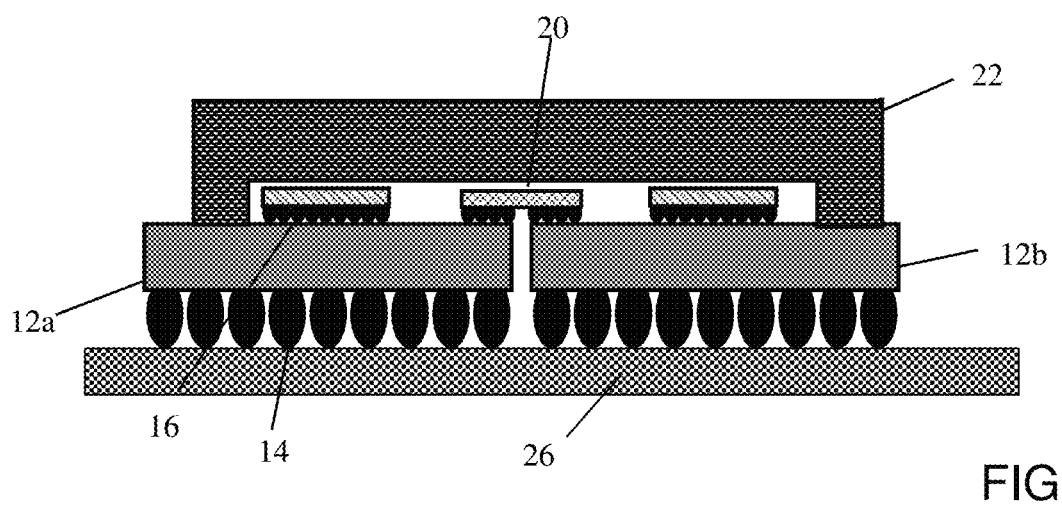

FIGS. 7A-7D show an assembly process for the partitioned substrates, interconnect bridge assembly and lid in accordance with aspects of the present disclosure. In FIG. 7A, the chips 16 are connected to the substrates 12a, 12b by, e.g., a reflow process. The substrates 12a, 12b are placed onto a system card 26 and bonded thereto by reflow of the BGAs 18. In embodiments, the reflow process can be performed at a later stage, e.g., during reflow of the interconnect bridge 20 to the substrates 12a, 12b or after TIM and lid bonding. In FIG. 7B, the interconnect bridge 20 is aligned with the wirings of the substrates 12a, 12b. After alignment, the interconnect bridge 20 is placed on the substrates 12a, 12b and a reflow process is performed to mechanically connect the interconnect bridge 20 to the substrates 12a, 12b. In FIG. 7C, a dispenser 28 is used to apply TIM to the interconnect bridge 20, the substrates 12a, 12b and the chips 16. An adhesive can also be applied to the lid 22 and/or the substrates 12a, 12b. Thereafter, the lid 22 is aligned with the substrates 12a, 12b and adhered to the substrates 12a, 12b as shown in FIG. 7D.

In alternative embodiments using the lid assembly shown in FIGS. 5A and 5B, for example, the chips 16 and lid 22a can be first connected to the substrates 12a, 12b and, thereafter, the interconnect bridge 20 can be aligned with and bonded to the substrates 12a, 12b via use of the opening 22b in the lid 22a. The lid 22a can then be locked together via the mechanical system 27. After alignment, bonding and locking, the TIM 24 can be dispensed through the opening 22b to encapsulate the chips 16 and interconnect bridge 20 under the lid 22a.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An integrated circuit package comprising:
    a plurality of package substrates comprising a first package substrate and a second package substrate, the first package substrate comprising a first plurality of electrical mounting connections, and the second package substrate comprising a second plurality of electrical mounting connections, wherein the first package substrate and the second package substrate are configured to be attached to a printed circuit board via the first plurality of electrical mounting connections and the second plurality of electrical mounting connections;
    a plurality of chips bonded and electrically connected respectively to the plurality of package substrates, the plurality of chips comprising a first chip and a second chip, the first chip is disposed on an opposite side of the first package substrate as the first plurality of electrical mounting connections, and the second chip is disposed on an opposite side of the second package substrate as the second plurality of electrical mounting connections; and
    an interconnect bridge comprising dielectric material, the interconnect bridge configured to physically connect the first package substrate to the second package substrate and configured such that when the plurality of package substrates are attached to the printed circuit board, a portion of the dielectric material, disposed closest to the printed circuit board, does not contact the printed circuit board, wherein the interconnect bridge is (i) disposed on and physically connected to a same surface of the first package substrate as the first plurality of electrical mounting connections, (ii) disposed on and physically connected to a same surface of the second package substrate as the second plurality of electrical mounting connections, and (iii) disposed between the first plurality of electrical mounting connections and the second plurality of electrical mounting connections,
    wherein the first package substrate, the second package substrate and the interconnect bridge electrically connect the first chip to the second chip.

2. The integrated circuit package of claim 1, wherein:
    the interconnect bridge comprises a rigid substrate; and
    the rigid substrate comprises wiring layers for electrically interconnecting the first package substrate to the second package substrate.

3. The integrated circuit package of claim 1, wherein the plurality of package substrates are each at or below 75 mm in size.

4. The integrated circuit package of claim 1, wherein the plurality of package substrates are each 60 mm in size.

5. The integrated circuit package of claim 1, wherein the plurality of package substrates comprise more than two package substrates.

6. The integrated circuit package of claim 1, wherein the interconnect bridge physically connects to the plurality of package substrates and electrically connects to each of the plurality of chips.

7. The integrated circuit package of claim 6, further comprising a lid that is adhered to selected ones of the plurality of package substrates and covers the plurality of chips and portions of the plurality of package substrates.

8. The integrated circuit package of claim 1, wherein:
the first plurality of electrical mounting connections are implemented as a first ball grid array; and
the second plurality of electrical mounting connections are implemented as a second ball grid array.

9. The integrated circuit package of claim 8, wherein a height of the interconnect bridge is less than a height of the first ball grid array and a height of the second ball grid array to provide an air gap between the interconnect bridge and the printed circuit board when the plurality of packages substrates are mounted on the printed circuit board.

10. The integrated circuit package of claim 1, wherein the first package substrate and the second package substrate are lowermost layers within the integrated circuit package.

11. The integrated circuit package of claim 1, wherein the interconnect bridge comprises:
a first layer comprising first wires;
a second layer comprising second wires, the first wires and the second wires electrically connect the first package substrate to the second package substrate; and
a dielectric layer disposed between the first layer and the second layer.

12. The integrated circuit package of claim 1, wherein:
the first package substrate comprises
a first layer comprising first wires,
a second layer comprising second wires, and
a core disposed between the first layer and the second layer; and
the second package substrate comprises
a first layer comprising first wires,
a second layer comprising second wires, and
a core disposed between the first layer of the second package substrate and the second layer of the second package substrate.

13. The integrated circuit package of claim 1, comprising a plurality of interconnect bridges connecting the first package substrate to other ones of the plurality of package substrates, wherein:
the other ones of the plurality of package substrates include the second package substrate;
the plurality of interconnect bridges comprise the interconnect bridge, which physically connects the first package substrate to the second package substrate; and
the first package substrate is a centrally located and surrounded by the other ones of the plurality of package substrates.

14. A circuit comprising:
the integrated circuit package of claim 1; and
the printed circuit board,
wherein
the plurality of package substrates are attached to the printed circuit board, and
a height of the interconnect bridge is less than a height of a first ball grid array of the first package substrate and a height of a second ball grid array of the second package substrate to provide an air gap between the interconnect bridge and the printed circuit board such that the portion of the interconnect bridge closest to the printed circuit board does not contact the printed circuit board.

15. An integrated circuit package comprising:
a plurality of package substrates;
a plurality of chips electrically connected respectively to the plurality of package substrates;
an interconnect bridge physically and electrically connecting the plurality of package substrates to one another, the interconnect bridge and the plurality of package substrates electrically connecting the plurality of chips to each other; and
a lid covering the plurality of chips and the interconnect bridge, the lid comprising
a plurality of discrete members locked together, and
an opening defined by the discrete members and providing access to the interconnect bridge while the discrete members are locked together and attached to the plurality of package substrates.

16. The integrated circuit package of claim 15, wherein:
the plurality of package substrates comprise a first package substrate and a second package substrate;
the interconnect bridge comprises a rigid substrate; and
the rigid substrate comprises wiring layers for electrically interconnecting the first package substrate to the second package substrate.

17. The integrated circuit package of claim 15, wherein the plurality of package substrates are each 75 mm or less in size.

18. The integrated circuit package of claim 15, wherein the plurality of package substrates comprise two or more package substrates.

19. The integrated circuit package of claim 15, wherein the opening provides access through which to insert the interconnect bridge and place the interconnect bridge on the plurality of package substrates.

20. The integrated circuit package of claim 15, further comprising thermal interface material disposed between an underside of the lid and the plurality of package substrates and over the interconnect bridge and the plurality of chips.

21. The integrated circuit package of claim 15, wherein:
the plurality of chips comprise a first chip and a second chip; and
the first chip is a different size than the second chip.

22. The integrated circuit package of claim 15, further comprising a system card, wherein the plurality of package substrates are electrically connected to the system card by a plurality of respective ball grid arrays.

* * * * *